(12) United States Patent
Park et al.

(10) Patent No.: US 11,823,973 B2
(45) Date of Patent: Nov. 21, 2023

(54) PACKAGE WITH COMPARTMENTALIZED LID FOR HEAT SPREADER AND EMI SHIELD

(71) Applicant: STATS ChipPAC Pte. Ltd., Singapore (SG)

(72) Inventors: DongSam Park, Incheon (KR); KyungOe Kim, Incheon (KR); WooJin Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 105 days.

(21) Appl. No.: 17/451,036

(22) Filed: Oct. 15, 2021

(65) Prior Publication Data

US 2023/0119942 A1    Apr. 20, 2023

(51) Int. Cl.

| | |
|---|---|
| *H01L 23/367* | (2006.01) |
| *H01L 25/00* | (2006.01) |
| *H01L 25/16* | (2023.01) |
| *H01L 25/065* | (2023.01) |
| *H01L 23/552* | (2006.01) |
| H01L 23/00 | (2006.01) |

(52) U.S. Cl.
CPC ........ *H01L 23/3675* (2013.01); *H01L 23/552* (2013.01); *H01L 25/0655* (2013.01); *H01L 25/16* (2013.01); *H01L 25/50* (2013.01); *H01L 24/16* (2013.01); *H01L 2224/16225* (2013.01)

(58) Field of Classification Search
CPC .......................... H01L 23/3675; H01L 23/552
See application file for complete search history.

(56) References Cited

U.S. PATENT DOCUMENTS

| | | | |
|---|---|---|---|
| 6,956,285 B2 | 10/2005 | Radu et al. | |
| 10,269,609 B2 * | 4/2019 | Truhitte | H01L 24/96 |
| 10,867,949 B2 * | 12/2020 | Cheng | H01L 25/105 |
| 11,222,868 B2 * | 1/2022 | Schrock | H01L 23/053 |
| 11,296,032 B2 * | 4/2022 | Tsou | H01L 23/49838 |
| 11,302,643 B2 * | 4/2022 | Ganesan | H01L 25/50 |
| 11,456,245 B2 * | 9/2022 | Tsou | H01L 25/105 |
| 2020/0098655 A1 | 3/2020 | Nair et al. | |

* cited by examiner

*Primary Examiner* — Thao P Le
(74) *Attorney, Agent, or Firm* — Brian M. Kaufman; Robert D. Atkins; Atkins and Associates, P.C.

(57) ABSTRACT

A semiconductor device has a substrate and two semiconductor die disposed over the substrate. A thermal interface material is disposed over the semiconductor die. A conductive epoxy is disposed on a ground pad of the substrate. A lid is disposed over the semiconductor die. The lid includes a sidewall over the ground pad between the semiconductor die. The lid physically contacts the conductive epoxy and thermal interface material.

24 Claims, 14 Drawing Sheets

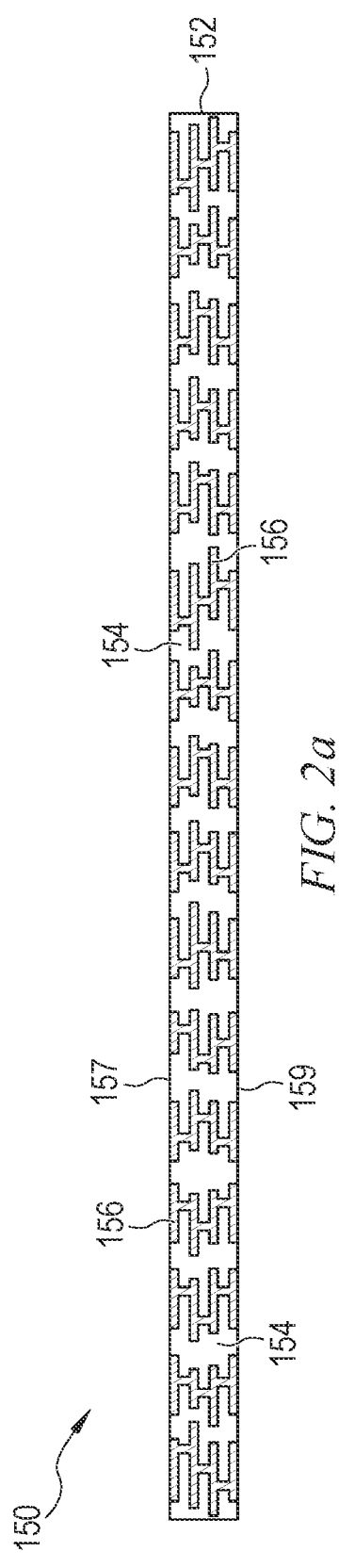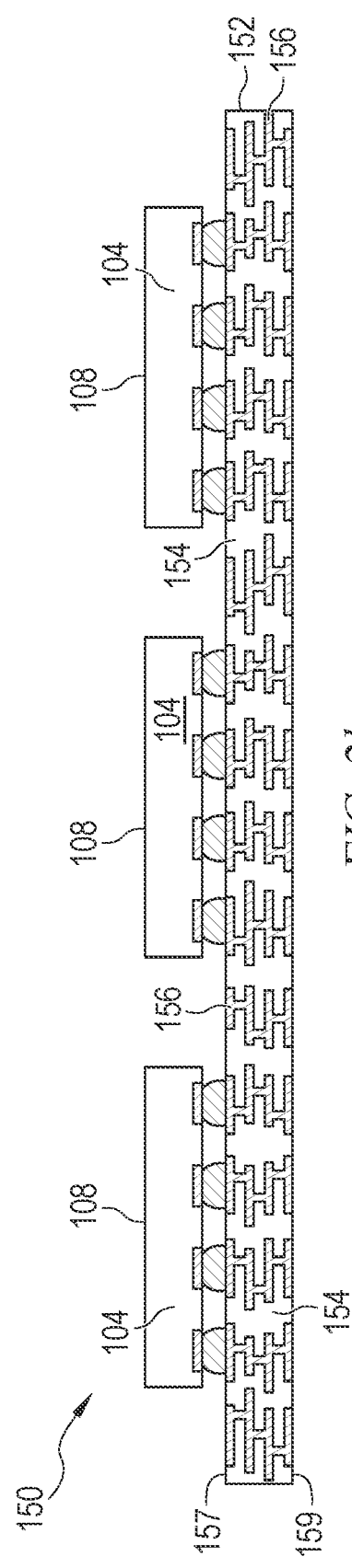

//PACKAGE WITH COMPARTMENTALIZED LID FOR HEAT SPREADER AND EMI SHIELD

FIELD OF THE INVENTION

The present invention relates in general to semiconductor devices and, more particularly, to a semiconductor device and method of forming a shielded semiconductor device using a compartmentalized lid both as a heat spreader and for electromagnetic interference (EMI) shielding.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

EMI shielding is typically formed over and around semiconductor packages to block inter-device interference. In many cases, a package can have EMI shielding within the package to reduce intra-package interference. However, EMI shielding methods in the prior art are commonly lacking in many important areas. Forming both inter-device and intra-package EMI shielding can add many costly and challenging steps to the manufacturing process. Moreover, prior art EMI shielding typically does not operate sufficiently as a heat spreader for underlying components. Therefore, a need exists for an improved EMI shielding method and device.

BRIEF DESCRIPTION OF THE DRAWINGS

FIGS. 2a-2l illustrate formation of a shielded semiconductor package using a compartmentalized lid;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
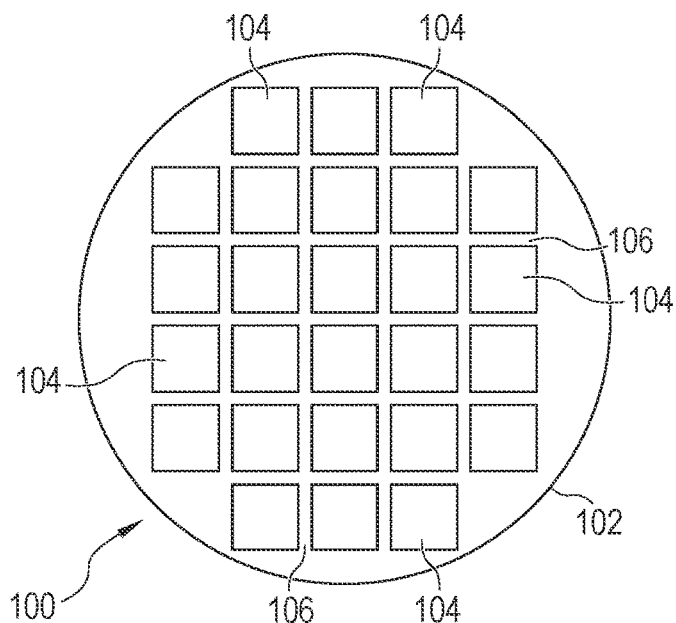
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
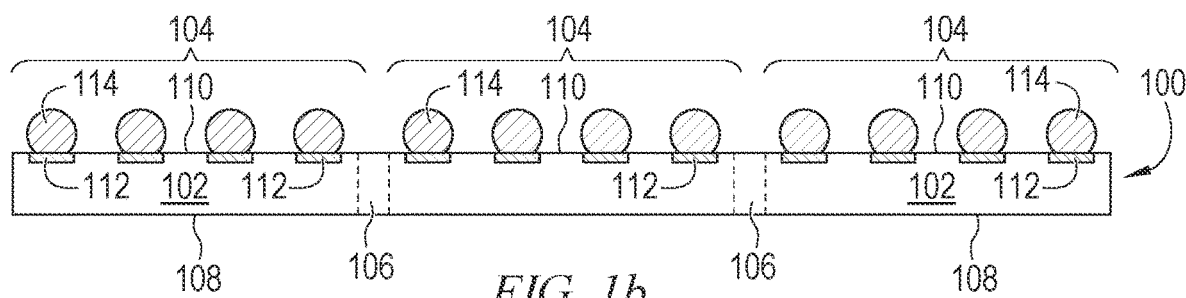

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating, or another suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1B. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, combinations thereof, or other suitable conductive material with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, or other electrical interconnect.

Figure 1C:
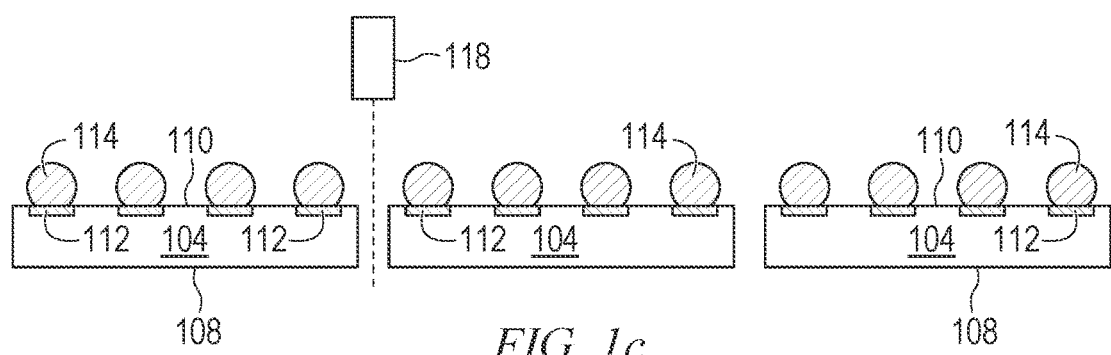

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

Figure 2C:
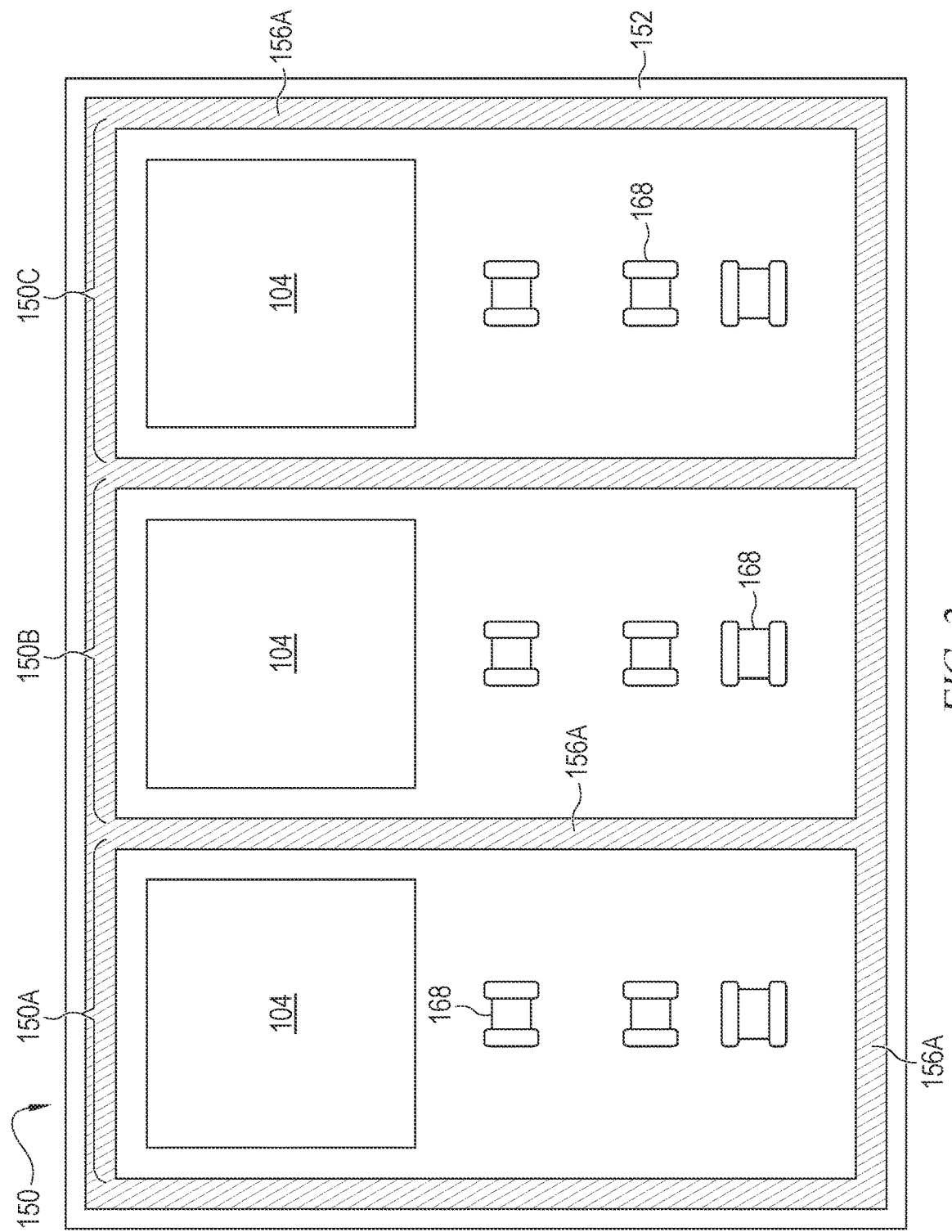

FIGS. 2a-2l illustrate forming semiconductor packages 150 with semiconductor die 104. FIG. 2a is a partial cross-sectional view of a substrate 152 used as a base for manufacturing the packages. Substrate 152 can be a unit substrate singulated from a larger panel or remain as part of a larger substrate panel. Hundreds or thousands of packages are commonly formed in a single substrate panel, or on a common carrier with unit substrates, using the same steps described herein for a single unit but performed en masse.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Any components desired to implement the intended functionality of packages 150 are mounted to or disposed over substrate 152 and electrically connected to conductive layers 156. Substrate 152 has two major surfaces: top surface 157 and bottom surface 159. Electrical components can be mounted onto top surface 157 and bottom surface 159 in any suitable configuration.

In FIG. 2b, manufacturing of package 150 on substrate 152 commences with surface mounting of semiconductor die 104 and discrete component 164 on top surface 157. Semiconductor die 104 can be picked and placed onto substrate 152 with bumps 114 on contact pads of conductive layer 156. Discrete components 164, e.g., resistors, capacitors, inductors, transistors, or diodes as shown in the plan view of FIG. 2c, are mounted using solder paste or another suitable attachment and connection mechanism. The solder paste is reflowed between terminals of discrete components 164 and contact pads of conductive layers 156 on top surface 157 at the same time as bumps 114 are reflowed to attach semiconductor die 104. In some embodiments, an adhesive or underfill layer is used between semiconductor die 104 and substrate 152.

FIG. 2c shows a plan view of substrate 152 with semiconductor die 104 and discrete components 168. Discrete components 168 exist in different cross-sections from the cross-section of FIG. 2b, and therefore are not shown in FIG. 2b. Semiconductor package 150 is split into three different functional compartments, 150a, 150b, and 150c. Each of compartments 150a-150c includes a separate semiconductor die 104 and separate discrete components 168. Semiconductor die 104 and discrete components 168 can be identical between each of compartments 150a-150c, or the different areas can have completely different types and number of components.

A lid disposed over substrate 152 will be electrically coupled to conductive layer 156 for grounding, thereby improving EMI shielding of the lid. Therefore, an area of conductive layer 156 is left exposed as a ground pad 156a for later electrical connection of the lid. In one embodiment, as shown in FIG. 2c, ground pad 156a forms a continuous path in every place where the lid is intended to provide EMI reduction in a direction parallel to surface 157. Ground pad 156a completely encompasses each compartment 150a-150c in plan view because the shielding ultimately formed is desired to protect each compartment from the others as well as from outside of the package. The lid will have sidewalls that follow ground pad 156a and surround each of the compartments 150a-150c.

Figure 2D:
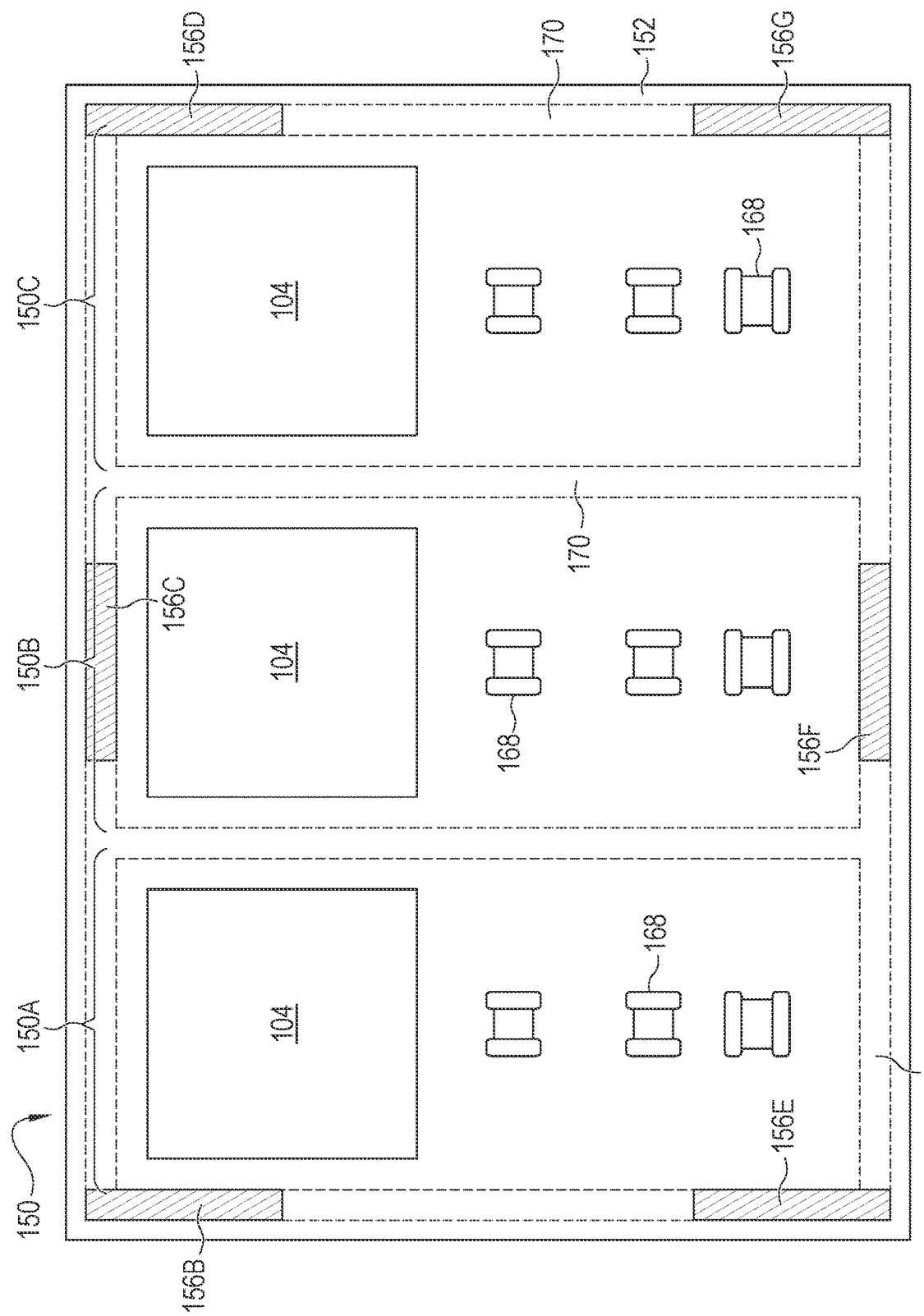

Alternatively, separate discontinuous ground pads 156b-156g can be exposed as shown in FIG. 2d instead of a continuous boundary around each compartment 150a-150c. The lid will typically still form a complete boundary around the perimeter of each compartment 150a-150c as shown by the dotted lines illustrating compartment boundaries 170. Compartment boundaries 170 are drawn to illustrate where the lid will have sidewalls to provide lateral EMI protection. However, only a few discrete points will be directly electrically coupled to substrate 150 through ground pads 156b-

156g. Having discrete ground pads 156b-156g instead of one continuous ground pad 156a eases signal routing requirements and can easily be configured to provide sufficient current handling capacity to the lid. Discrete areas can be positioned in any suitable number and pattern within perimeter lines 170.

Figure 2E:
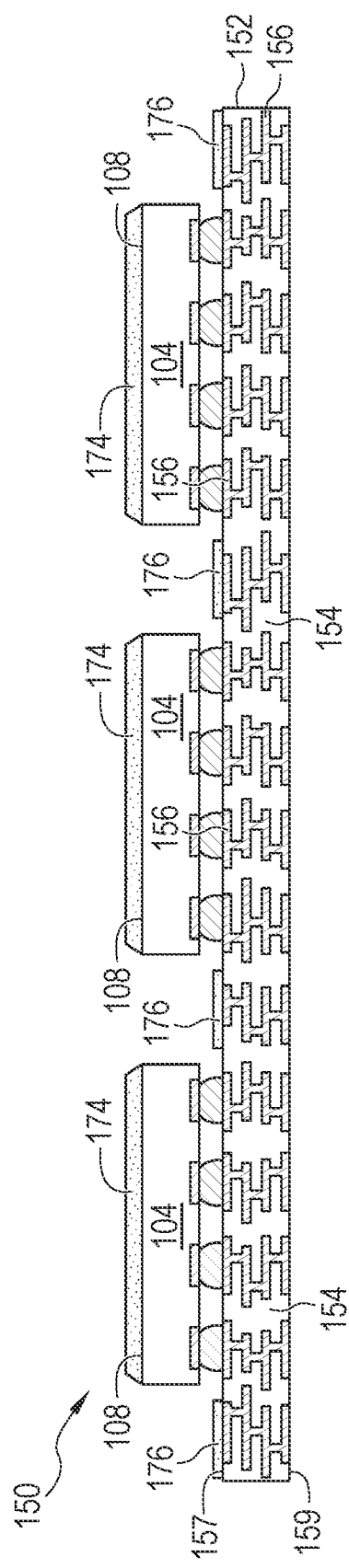

In FIG. 2e, substrate 152 with semiconductor die 104 and discrete components 168 is prepared for installation of the lid by dispensing thermal interface material (TIM) 174 on back surfaces 108 of semiconductor die 104. TIM 174 will facilitate thermal transfer from semiconductor die to the overlying lid, as discussed below.

Figure 2F:
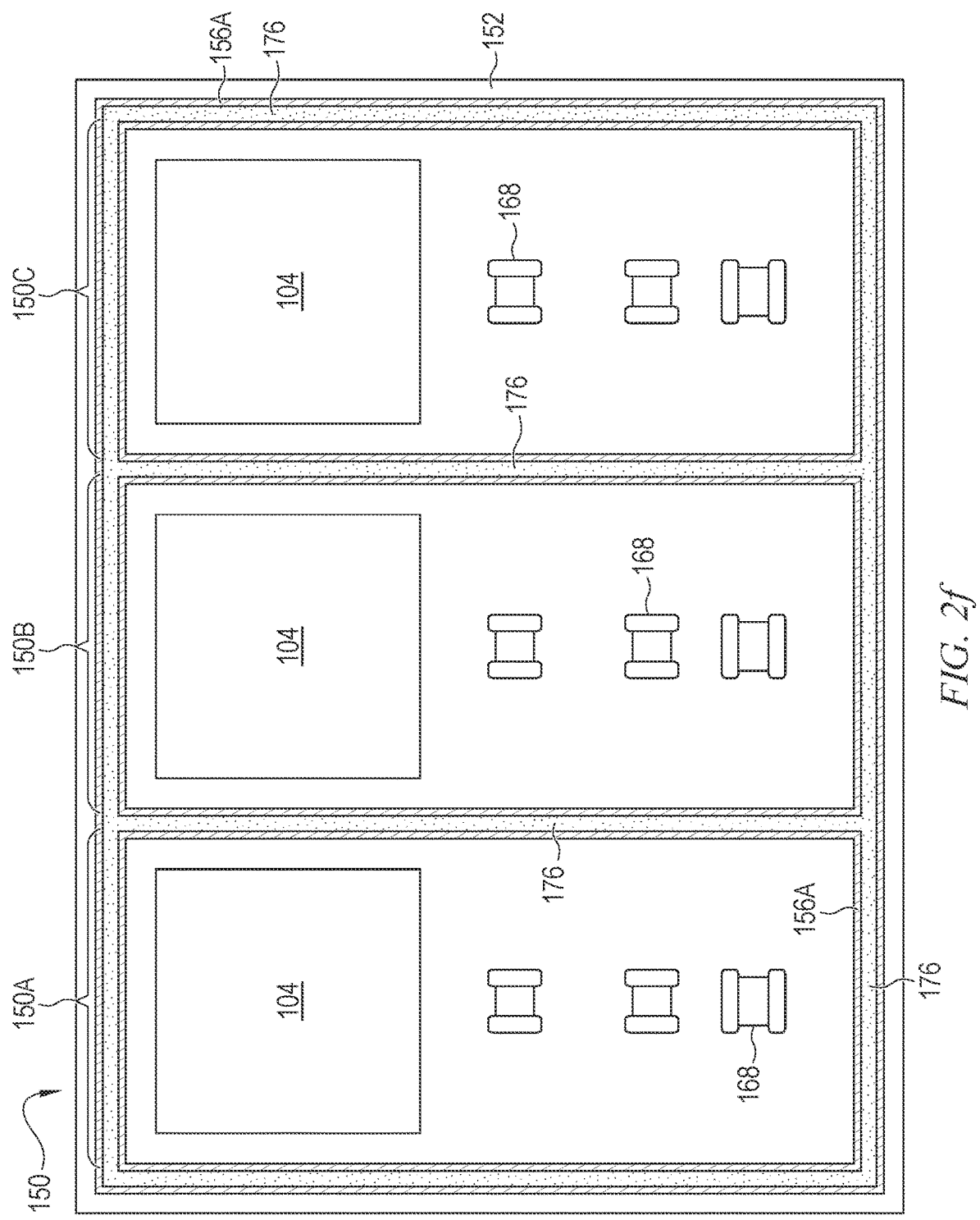

In addition, a conductive epoxy 176 is dispensed on the exposed ground pads of conductive layer 156 within compartment boundaries 170. Conductive epoxy 176 is a polymer-based molding compound with particles of gold, silver, steel, aluminum, copper, or another suitable conductive material embedded within the molding compound to impart electrical conductivity. A bead of conductive epoxy 176 can be formed continuously along the length of all portions of ground pad 156a as shown in FIG. 2f, such that epoxy 176 forms a complete boundary around each compartment 150a-150c as ground pad 156a does.

Figure 2G:
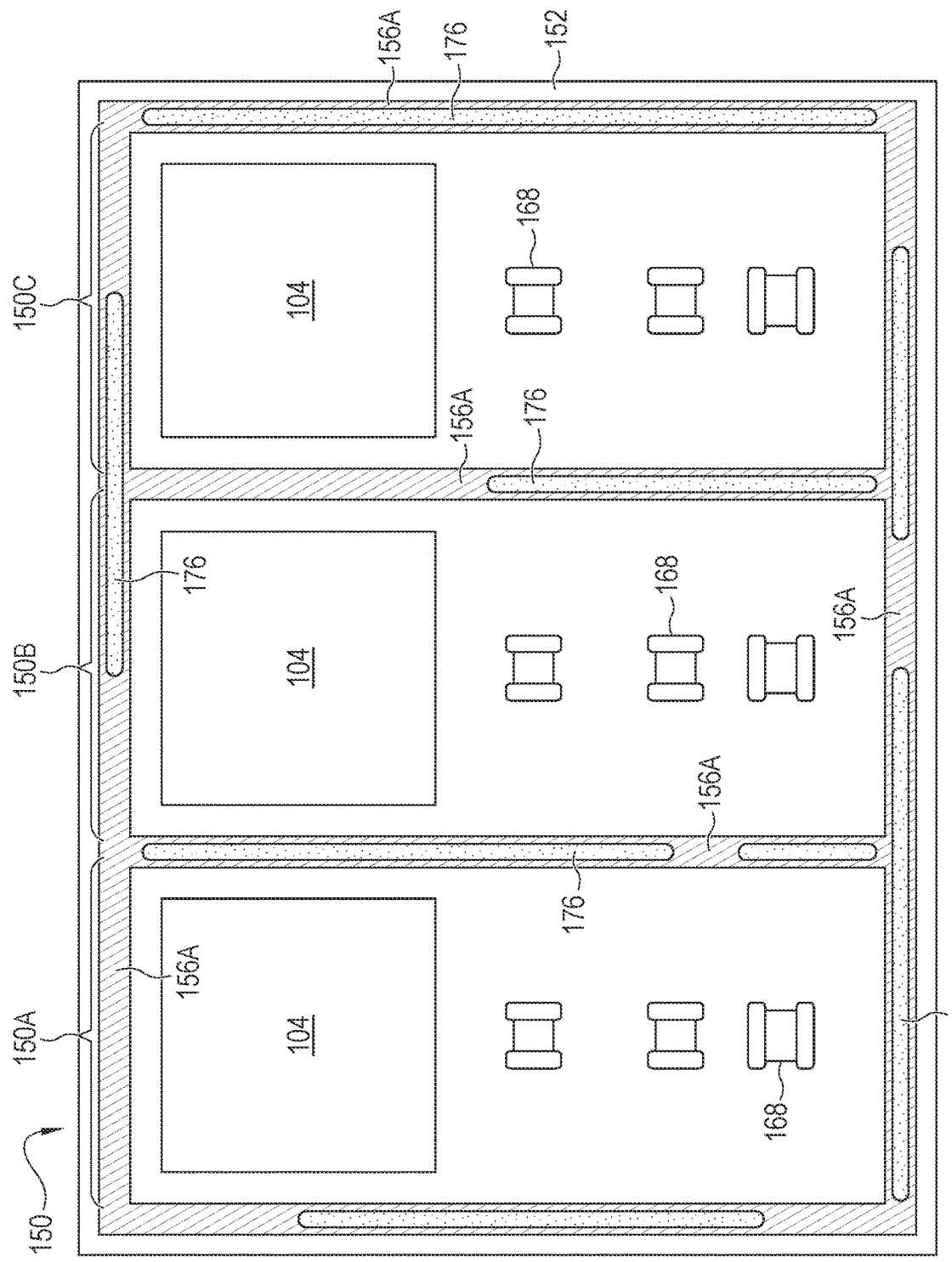
Figure 2H:
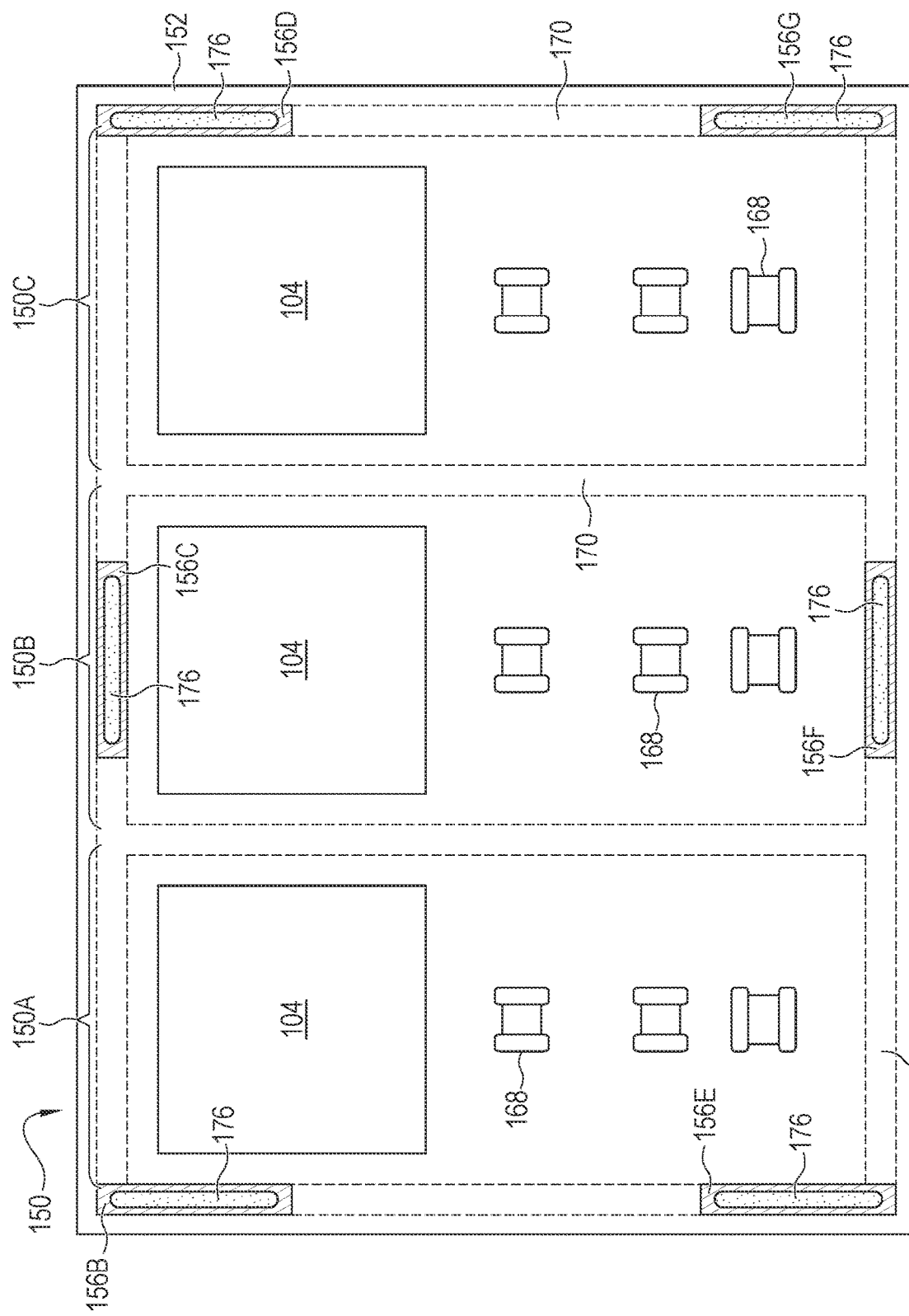

In other embodiments, epoxy 176 is dispensed selectively over only certain portions of ground pad 156a as shown in FIG. 2g. Epoxy 176 can be dispensed in any desired pattern as long as the contact area of the epoxy is adequate to provide sufficient electrical and mechanical coupling of the lid to substrate 152. In the case where a plurality of discrete ground pads is used, e.g., ground pads 156b-156g, epoxy 176 is generally, but not necessarily, dispensed on each ground pad as shown in FIG. 2h.

Figure 2I:
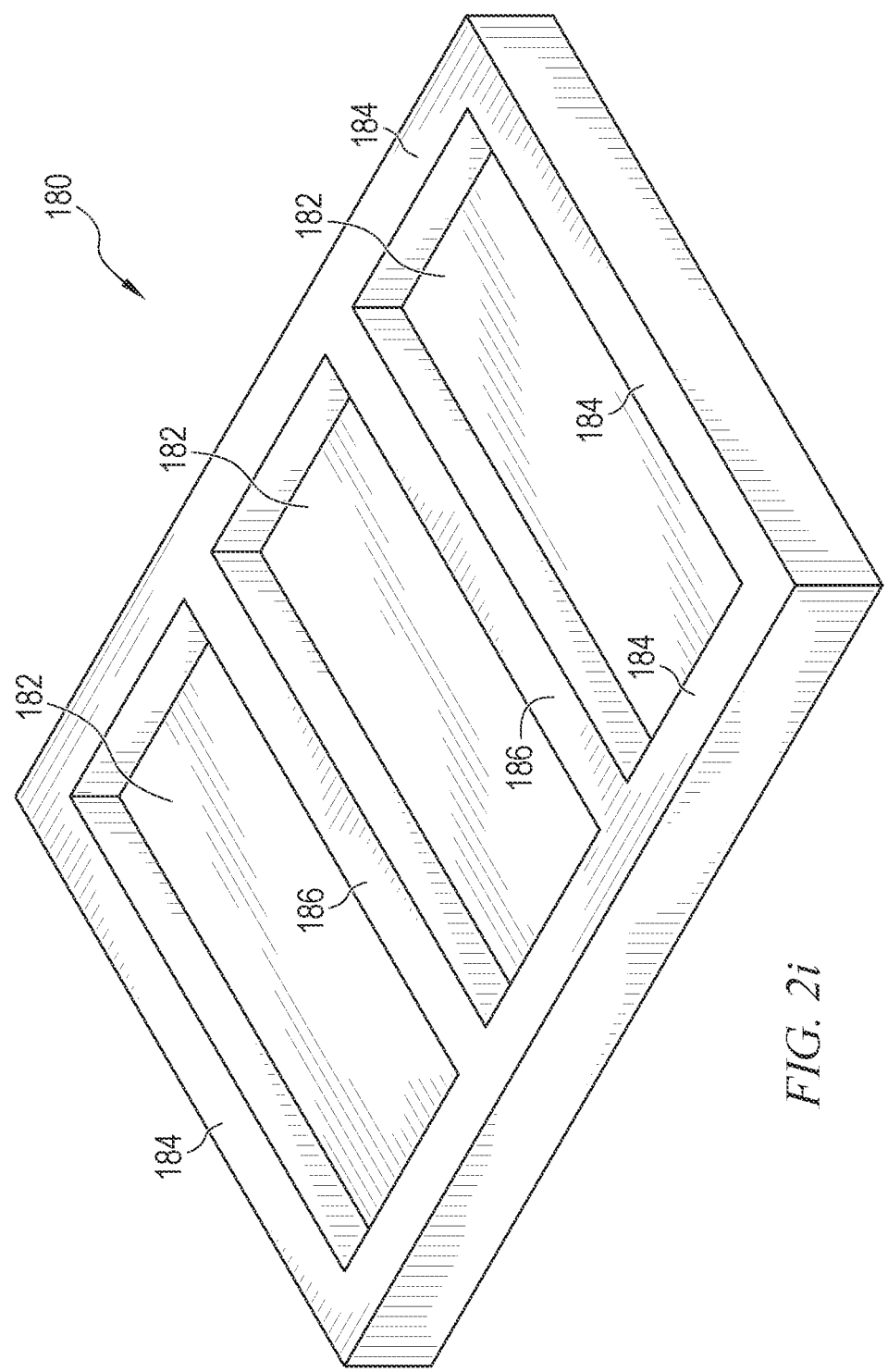

FIG. 2i shows a lid 180 to be disposed over substrate 152. Lid 180 is formed from a sheet of metal, typically copper, aluminum, steel, gold, combinations thereof, alloys thereof, or other suitable EMI blocking materials. A plurality of cavities 182 is formed into the sheet of material using chemical, mechanical, or laser etching, or another suitable means. In the illustrated embodiment, three cavities 182 are formed corresponding to the three compartments 150a-150c on substrate 152. If more or less compartments are being formed, then the number of cavities 182 is adjusted to match.

Removal of material to form cavities 182 leaves sidewalls 184 and 186 surrounding the cavities. Sidewalls 184 and 186 remain at the full thickness of the original sheet of material. In other embodiments, the sheet can be backgrinded or etched to reduce an overall thickness. Sidewalls 184 remain along the entire perimeter of lid 180. Sidewalls 186 remain between adjacent cavities 182. Lid 180 is singulated through sidewalls 184 from a larger sheet of metal in some embodiments.

Figure 2J:
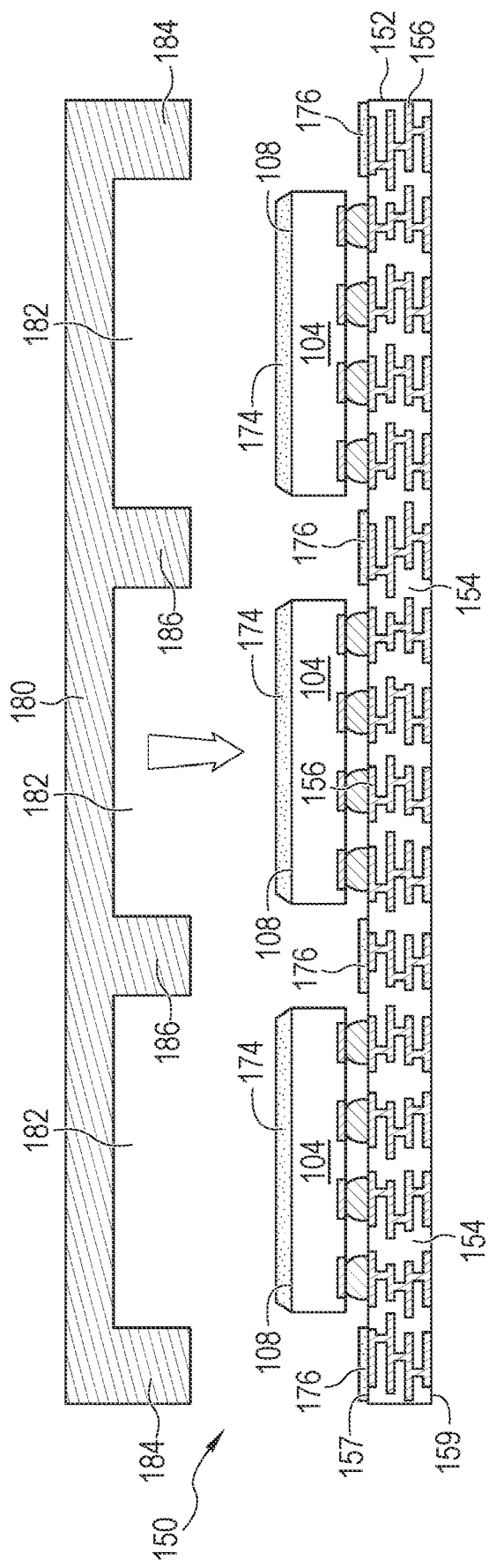
Figure 2K:
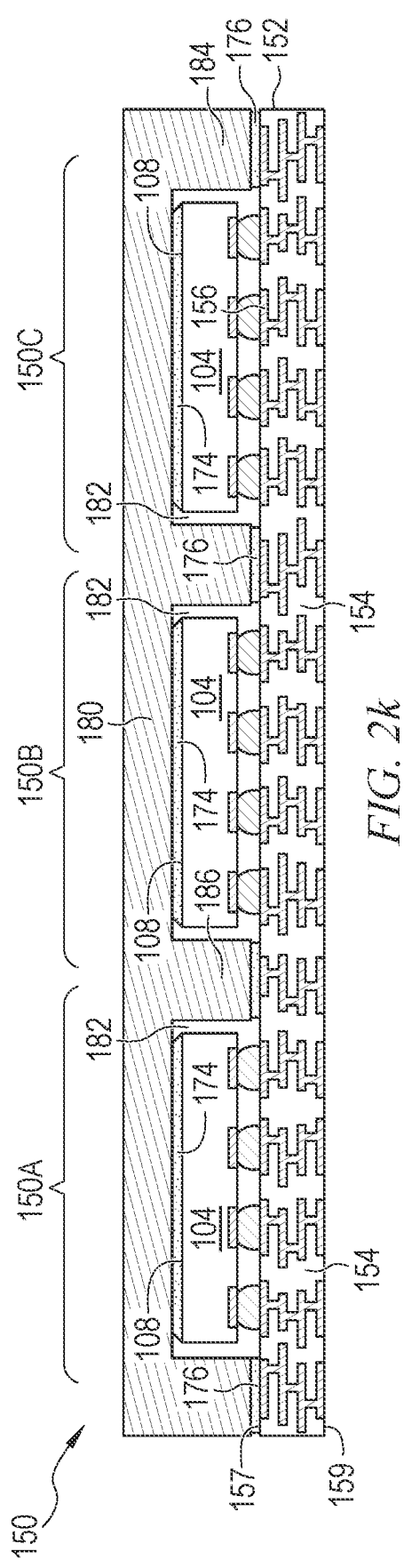

In FIG. 2j, lid 180 is disposed over substrate 152 and then pressed down onto TIM 174 and epoxy 176 as shown in FIG. 2k. TIM 174 extends from back surface 108 of semiconductor die 104 to a bottom surface of a cavity 182 to facilitate thermal transfer between the die and lid 180. Lid 180 will generally be pressed down until the lid physically contacts semiconductor die 104, or very nearly so, with TIM 174 filling in gaps between the surfaces that are the result of asperities and other imperfections in the surfaces.

The bottoms of sidewalls 184 and 186 are pressed down onto epoxy 176. Epoxy 176 extends between substrate 152 and sidewalls 184-186 and is cured to adhere lid 180 to the substrate. Epoxy 176 is electrically conductive so lid 180 is electrically coupled to substrate 152 by the epoxy. Sidewalls 184 and the top of lid 180 surround all components of package 150 to protect the components from inter-package interference. Sidewalls 186 extend between compartments 150a-150c to reduce intra-package interference.

Figure 2L:
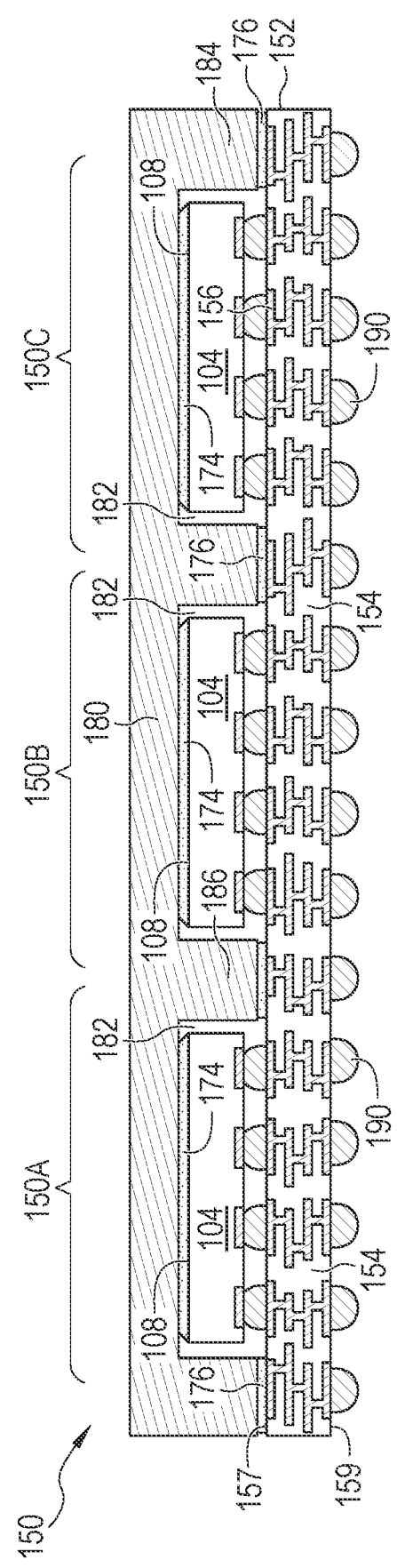

Package 150 is completed in FIG. 2l by applying solder bumps 190 to bottom surface 159 of substrate 152 in any suitable method, similar to the application of bumps 114 in FIG. 1B. Bumps 190 are subsequently used to install package 150 into a larger electrical system. In some embodiments, a plurality of packages 150 is formed as a panel and then singulated from each other after completion.

Lid 180 provides both EMI protection and heat spreader capability to package 150. Lid 180 is connected to ground through epoxy 176 and substrate 152 to help reduce EMI flowing through the lid. Lid 180 completely surrounds the sides and top of all components on substrate 152. Sidewalls 186 extend between compartments of the package to block intra-package EMI. Semiconductor die 104 are thermally coupled to lid 180 using TIM 174 to allow the lid to operate as a heat spreader. An additional heat sink with fins or other structures to increase transfer of thermal energy to ambient can be formed as part of lid 180 or mounted to the top of the lid later during system integration. Lid 180 provides heat spreader capabilities in combination with EMI shielding capabilities for both inter-device and intra-device interference.

Figure 3A:
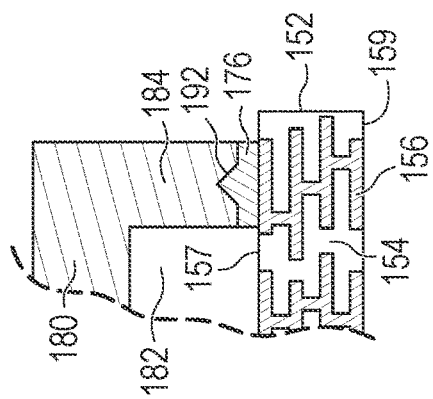
FIGS. 3a and 3b illustrate alternative embodiments for the compartmentalized lid.
Figure 3B:
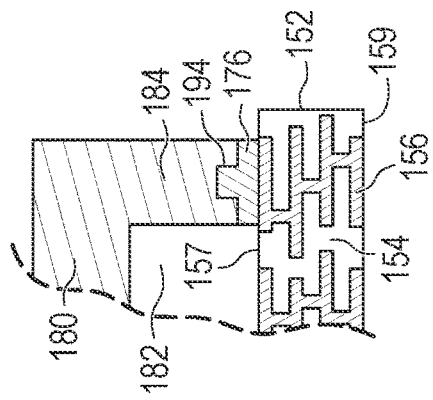

FIGS. 3a and 3b illustrate embodiments with notches formed in the bottoms of sidewalls 184. In FIG. 3a, a triangular notch 192 is formed in the bottom of sidewall 184. When lid 180 is pressed down onto substrate 152, epoxy 176 is pressed into and fills notch 192. The angled surfaces of notch 192 increase adhesion between lid 180 and substrate 152 by increasing the overall surface area that epoxy 176 contacts and also by varying the angles of applied pressure when a physical force is later applied to the lid. In FIG. 3b, a square or rectangular notch 194 is formed in the bottom of sidewall 184. Notch 194 operates similarly to and provides similar benefit to triangular notch 192. A notch similar to notches 192 and 194 can be formed in any suitable shape.

Notches 192 and 194 can be formed along the entire length of all sidewalls 184 and 186 in any embodiment. In embodiments where epoxy 176 is only deposited partially along the lengths of sidewalls 184 and 186, notches 192 or 194 can be limited to only the areas where epoxy will be deposited. As with TIM 174, lid 180 may be pressed down until the bottoms of sidewalls 184 and 186 physically contact substrate 152. Epoxy 176 fills in gaps left by asperities and other imperfections between the surfaces as well as any notches 192 or 194 being used.

Figure 4:
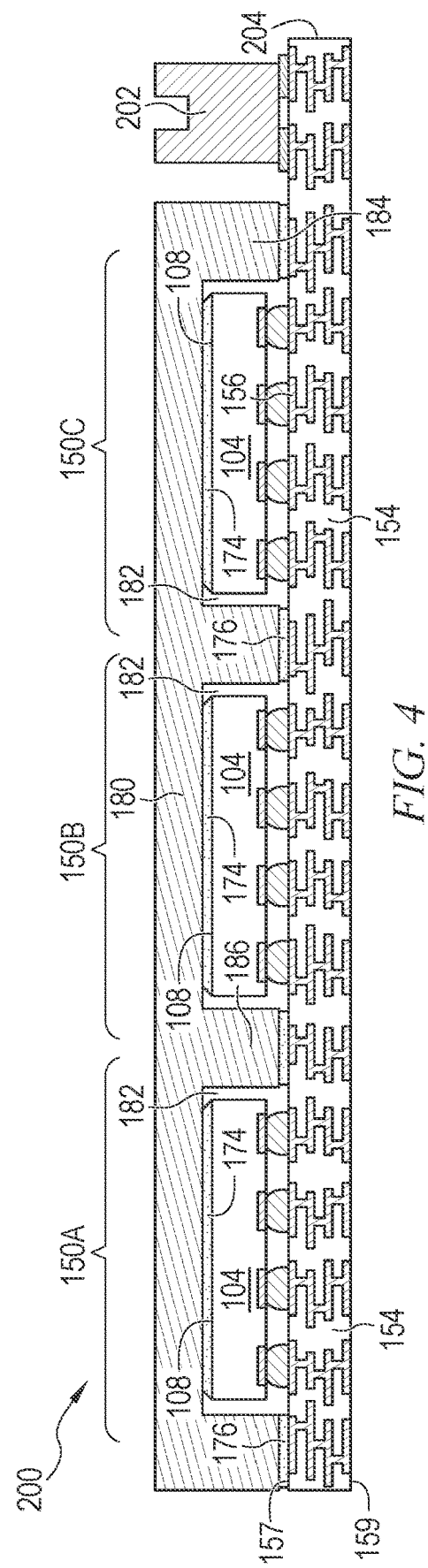
FIG. 4 illustrates an alternative package interconnection option.

FIG. 4 shows package 200, an embodiment with a board-to-board (B2B) or other connector 202 mounted adjacent to lid 180. A substrate 204 is used that has a larger footprint than lid 180, unlike substrate 152 which had substantially the same footprint as the lid. The extra footprint space of substrate 204 is used to mount a B2B connector 202, a micro-coax connector for connecting to an antenna, another type of connector, or any other electrical components desired. B2B connector 202 is electrically connected to semiconductor die 104 through conductive layers 156, and will be used for inter-device communication instead of or in addition to bumps 190.

Figure 5:
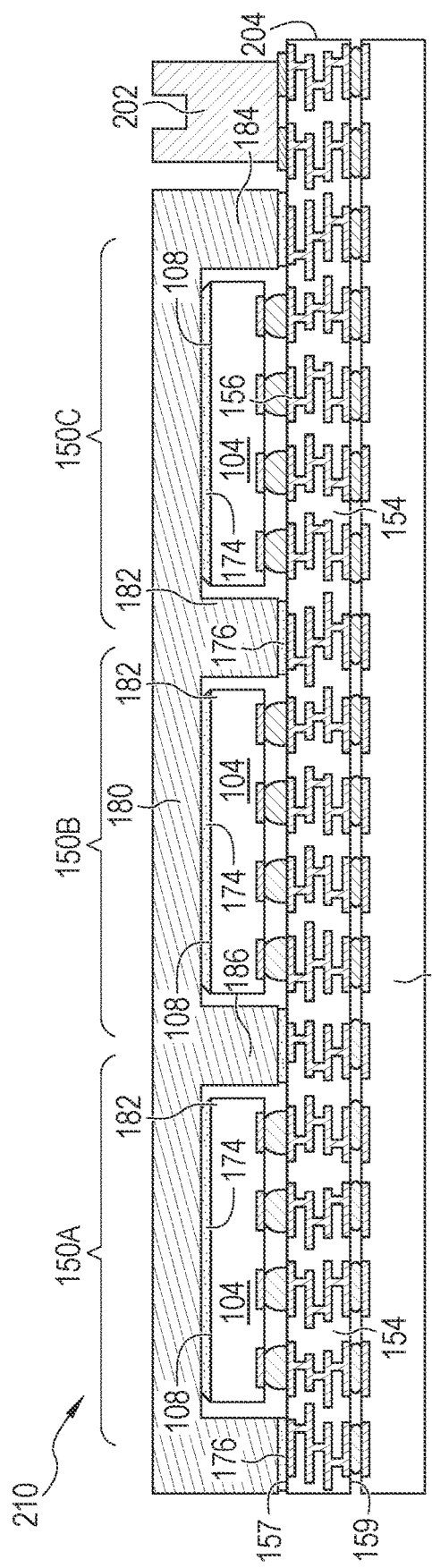
FIG. 5 illustrates an optional antenna substrate used with the package.

FIG. 5 illustrates package 210, an embodiment with an antenna PCB 212 mounted to bottom surface 159 of substrate 204, opposite semiconductor die 104 and lid 180. Antenna PCB 212 has one or more embedded antennae within the PCB, e.g., a 5G cellular antenna, WiFi antenna, Bluetooth antenna, etc. Antenna PCB 212 optionally also has conductive vias and traces similar to conductive layers 156 to interconnect to an underlying PCB. In other embodiments, antenna PCB 212 does not allow further integration to the bottom of package 210, and instead all interconnection to other system components is through B2B connector 202.

Figure 6A:
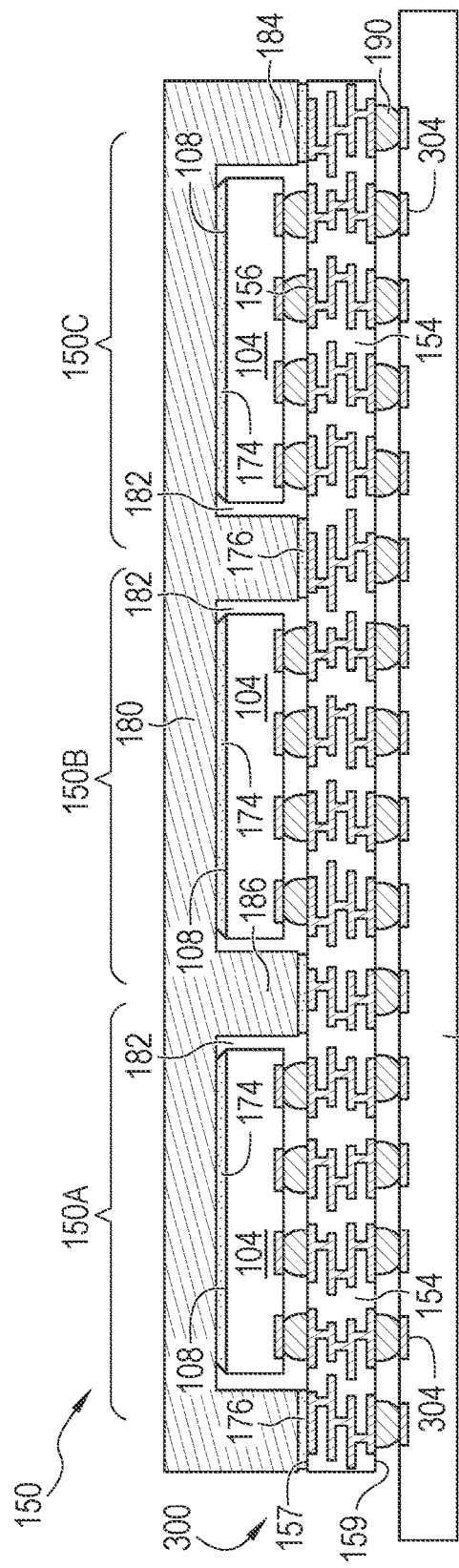
FIGS. 6a and 6b illustrate integrating the shielded packages into an electronic device.
Figure 6B:
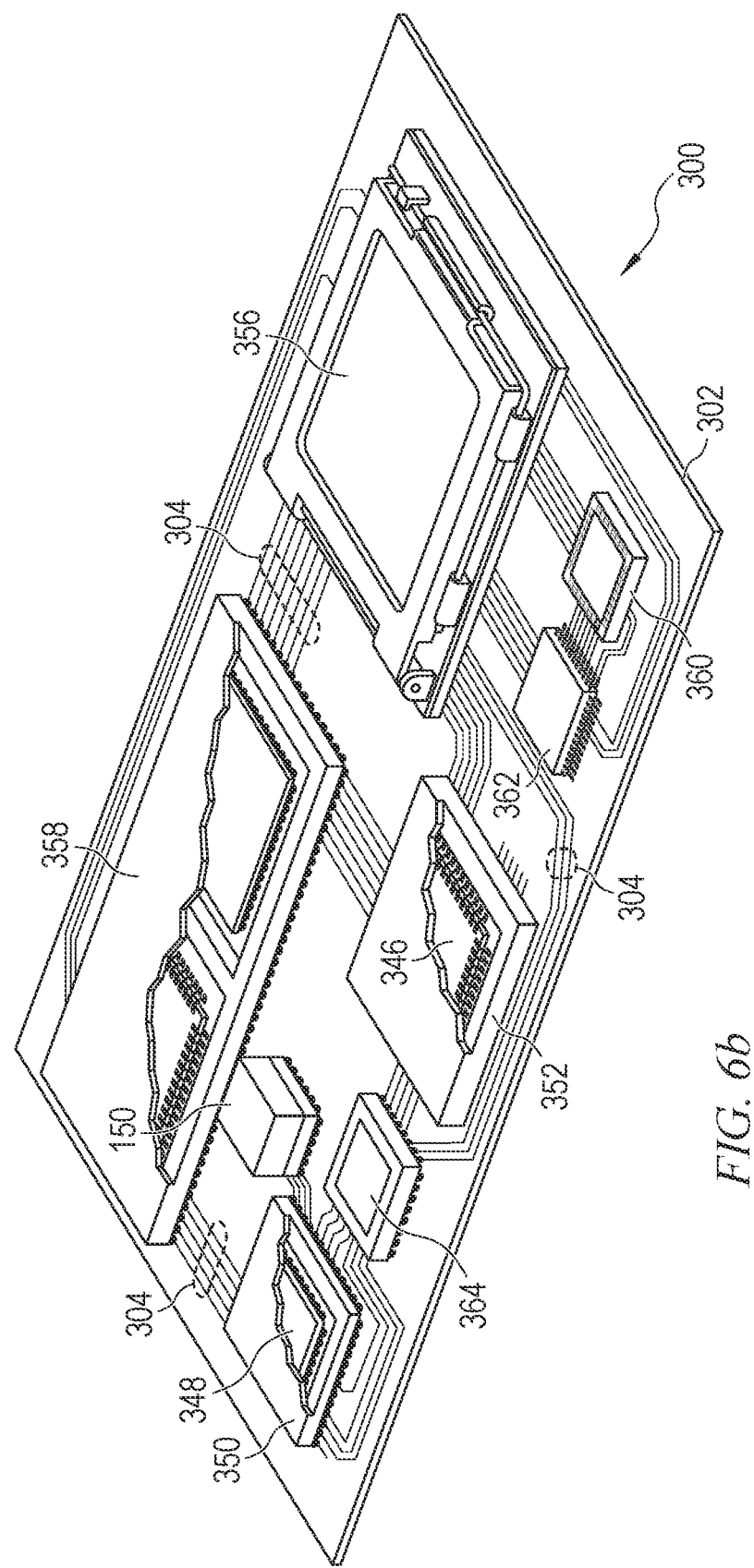

FIGS. 6a and 6b illustrate incorporating the above-described semiconductor packages, e.g., package 150, into an electronic device 300. FIG. 6a illustrates a partial cross-section of package 150 mounted onto a printed circuit board (PCB) or other substrate 302 as part of electronic device 300. Bumps 190 are reflowed onto conductive layer 304 of PCB 302 to physically attach and electrically connect package 150 to the PCB. In other embodiments, thermocompression or other suitable attachment and connection methods are used. In some embodiments, an adhesive or underfill layer is used between package 150 and PCB 302. Semiconductor die 104 are electrically coupled to conductive layer 304 through substrate 152 and bumps 190.

FIG. 6b illustrates electronic device 300 including PCB 302 with a plurality of semiconductor packages mounted on a surface of the PCB, including package 150. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 6b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with package 150. Conductive traces 304 electrically couple the various packages and components disposed on PCB 302 to package 150, giving use of the components within package 150 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    disposing a first semiconductor die and second semiconductor die over the substrate;
    disposing a thermal interface material (TIM) over the first semiconductor die and second semiconductor die;
    disposing a conductive epoxy on a ground pad of the substrate;
    forming a lid by etching a plurality of cavities into a sheet of metal; and
    disposing the lid over the first semiconductor die and second semiconductor die after etching the plurality of cavities into the sheet of metal, wherein the lid includes a sidewall over the ground pad between the first semiconductor die and second semiconductor die.

2. The method of claim 1, further including pressing the lid against the substrate to physically contact the conductive epoxy and TIM.

3. The method of claim 1, further including:
    forming a notch in the sidewall of the lid; and
    pressing the lid against the substrate so that the conductive epoxy extends into the notch.

4. The method of claim 1, further including disposing a connector over the substrate outside the lid.

5. The method of claim 1, further including attaching an antenna PCB to the substrate opposite the lid.

6. A method of making a semiconductor device, comprising:
    providing a substrate;
    disposing a first semiconductor die and second semiconductor die over the substrate;
    providing a lid including a cavity; and
    disposing the lid over the first semiconductor die and second semiconductor die after the lid already has a cavity, wherein the lid is thermally coupled to the first semiconductor die and second semiconductor die, and wherein the lid includes a sidewall between the first semiconductor die and second semiconductor die.

7. The method of claim 6, further including providing a thermal interface material extending from a surface of the first semiconductor die to a surface of the lid.

8. The method of claim 6, further including forming a notch in the sidewall of the lid.

9. The method of claim 6, further including disposing a connector over the substrate outside the lid.

10. The method of claim 6, further including attaching an antenna PCB to the substrate opposite the lid.

11. The method of claim 6, further including disposing a conductive epoxy between the substrate and lid.

12. The method of claim 6, wherein the lid includes a plurality of sidewalls that surround the first semiconductor die and second semiconductor die.

13. A semiconductor device, comprising:
a substrate;
a first semiconductor die disposed over the substrate;
a second semiconductor die disposed over the substrate;
a thermal interface material (TIM) disposed over the first semiconductor die and second semiconductor die;
an electrically conductive epoxy disposed on a ground pad of the substrate; and
a lid disposed over the first semiconductor die and second semiconductor die, wherein a sidewall of the lid is disposed over the ground pad between the first semiconductor die and second semiconductor die.

14. The semiconductor device of claim 13, wherein the lid physically contacts the electrically conductive epoxy and TIM.

15. The semiconductor device of claim 13, further including a notch formed in the sidewall of the lid, wherein the electrically conductive epoxy extends into the notch.

16. The semiconductor device of claim 13, further including a connector disposed over the substrate outside the lid.

17. The semiconductor device of claim 13, further including an antenna PCB attached to the substrate opposite the lid.

18. The semiconductor device of claim 13, wherein the lid includes a plurality of cavities.

19. A semiconductor device, comprising:
a substrate;
a first semiconductor die and second semiconductor die disposed over the substrate; and
a lid disposed over the first semiconductor die and second semiconductor die, wherein the lid is thermally coupled to the first semiconductor die and second semiconductor die, wherein the lid includes a sidewall between the first semiconductor die and second semiconductor die, and wherein the lid, including the sidewall, is formed of an electrically conductive material.

20. The semiconductor device of claim 19, further including a thermal interface material extending from a surface of the first semiconductor die to a surface of the lid.

21. The semiconductor device of claim 19, further including a notch formed in the sidewall of the lid.

22. The semiconductor device of claim 19, further including disposing a connector over the substrate outside the lid.

23. The semiconductor device of claim 19, further including attaching an antenna PCB to the substrate opposite the lid.

24. The semiconductor device of claim 19, further including disposing a conductive epoxy between the substrate and lid.

* * * * *